(12) United States Patent
Delga et al.

(10) Patent No.: US 12,543,397 B2
(45) Date of Patent: Feb. 3, 2026

(54) INTEGRATION OF A DETECTION CIRCUIT BASED ON OPTICAL RESONATORS ON A READOUT CIRCUIT OF AN IMAGER

(71) Applicants: THALES, Courbevoie (FR); COMMISSARIAT A L'ENERGIE ATOMIQUE ET AUX ENERGIES ALTERNATIVES, Paris (FR)

(72) Inventors: Alexandre Delga, Palaiseau (FR); Roch Espiau De Lamaestre, Grenoble (FR)

(73) Assignees: THALES, Courbevoie (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 432 days.

(21) Appl. No.: 18/269,277

(22) PCT Filed: Dec. 21, 2021

(86) PCT No.: PCT/EP2021/087003
§ 371 (c)(1),
(2) Date: Jun. 22, 2023

(87) PCT Pub. No.: WO2022/136378
PCT Pub. Date: Jun. 30, 2022

(65) Prior Publication Data
US 2024/0063245 A1 Feb. 22, 2024

(30) Foreign Application Priority Data
Dec. 23, 2020 (FR) ...................................... 2014016

(51) Int. Cl.
*H10F 39/00* (2025.01)
*H10F 30/10* (2025.01)
(Continued)

(52) U.S. Cl.
CPC .......... *H10F 39/809* (2025.01); *H10F 30/10* (2025.01); *H10F 30/2215* (2025.01);
(Continued)

(58) Field of Classification Search
CPC .... H10F 39/809; H10F 39/018; H10F 39/024; H10F 39/804; H10F 39/805;
(Continued)

(56) References Cited

U.S. PATENT DOCUMENTS

| 5,455,421 A | 10/1995 | Spears |
| 5,773,831 A | 6/1998 | Brouns |

(Continued)

FOREIGN PATENT DOCUMENTS

| EP | 3 410 486 A1 | 12/2018 |
| WO | 2019/180165 A1 | 9/2019 |

*Primary Examiner* — David Vu
*Assistant Examiner* — Brandon C Fox
(74) *Attorney, Agent, or Firm* — BakerHostetler

(57) ABSTRACT

An optoelectronic device includes at least one pixel, each pixel comprising an optical resonator comprising a photo-detecting structure confined between a reflective metal layer and a second reflective metal layer; and a readout integrated circuit arranged on a substrate and comprising at least one buried readout electrode dedicated to the pixel and at least one metal or dielectric outer layer. The assembly comprising at least the reflective metal layer and the outer layer of the readout integrated circuit is called a planar assembly structure. The first metal layer is connected to the readout electrode by way of a metal via passing through the optical resonator structure and the planar assembly structure. The metal via is electrically isolated from the photodetecting structure and from the planar assembly structure.

18 Claims, 11 Drawing Sheets

(51) Int. Cl.
*H10F 30/221* (2025.01)
*H10F 39/12* (2025.01)

(52) U.S. Cl.
CPC ......... *H10F 39/018* (2025.01); *H10F 39/024* (2025.01); *H10F 39/1935* (2025.01); *H10F 39/804* (2025.01); *H10F 39/805* (2025.01); *H10F 39/806* (2025.01); *H10F 39/811* (2025.01)

(58) Field of Classification Search
CPC ...... H10F 39/806; H10F 39/811; H10F 30/10; H10F 30/2215; H10F 39/1935
See application file for complete search history.

(56) References Cited

U.S. PATENT DOCUMENTS

| | | | |
|---|---|---|---|
| 12,094,903 B2 * | 9/2024 | Wang | H10F 39/184 |
| 2011/0156194 A1 | 6/2011 | Gravrand et al. | |
| 2019/0206921 A1 * | 7/2019 | Maruyama | G01J 5/045 |
| 2024/0321925 A1 * | 9/2024 | Delga | H10F 39/811 |

* cited by examiner

INTEGRATION OF A DETECTION CIRCUIT BASED ON OPTICAL RESONATORS ON A READOUT CIRCUIT OF AN IMAGER

CROSS-REFERENCE TO RELATED APPLICATIONS

This application is a National Stage of International patent application PCT/EP2021/087003, filed on Dec. 21, 2021, which claims priority to foreign French patent application No. FR 2014016, filed on Dec. 23, 2020, the disclosures of which are incorporated by reference in their entireties.

FIELD OF THE INVENTION

The invention relates to hybrid systems, that is to say systems formed of two separate parts that are assembled by an assembly layer, each part being made of a different material. These systems may be optical, electronic or optoelectronic depending on the features of the assembled parts. The invention relates in particular to the integration of a plurality of metal-insulator-metal optical resonators on a readout integrated circuit for a matrix image sensor in the infrared region. The matrix imager is formed of a plurality of pixels, and each pixel comprises a single optical resonator.

BACKGROUND

Hybrid systems make it possible to combine two functionalities implemented in different materials. These are for example:
- a detector, in which the sensitive part is associated with a readout circuit that makes it possible to collect and process the signal to be detected,
- a display, for example a light-emitting display, in which the emitting part is associated with a circuit for generating electrical signals suitable for emission,
- a photonic circuit, with laser emitters associated with layers for processing the emitted beams (guidance, multiplexing/demultiplexing, amplification, etc.), the one or more processing layers being deposited on a silicon substrate ("Photonic on Silicon"),
- an electronic circuit with fast transistors or power transistors associated with a control system.

The first two hybrid systems may be described as optoelectronic, the third may be purely optical or optoelectronic, while the fourth is purely electronic.

More specifically, the technical field in question is that of the production of hybrid optoelectronic systems, comprising:
- an optical part based on at least one photosensitive element for generating electric charge carriers from incident photons (for example a matrix of bolometers, photodiodes or photoconductors);
- and an electronic part consisting of a readout integrated circuit on a semiconductor substrate for individually reading the signal from each pixel of the optical part. A pixel belonging to the optoelectronic system may contain a single photosensitive element or a plurality of interconnected photosensitive elements.

There are some imager technologies in which the photosensitive layer consists of a first family of semiconductor materials and the readout integrated circuit is formed in a substrate of a second family of semiconductor materials different from the first. The photodetectors are produced using III-V semiconductor materials such as gallium arsenide, indium arsenide, gallium nitride, gallium antimonide and boron phosphide. The photodetectors may also be produced using II-VI semiconductor materials. To build a hybrid system, it is necessary to assemble the photodetectors and to interconnect them with the readout integrated circuit on a silicon substrate.

FIG. 1 illustrates a partial sectional view of a hybrid optoelectronic system according to the prior art, having an optical part comprising a metal diffraction grating behind each pixel. The optoelectronic device Dis1 illustrated in FIG. 1 is a vertical-transport infrared imager. It consists of an optical part OPT_D1 comprising at least one pixel Pxl_D1 and of an electronic part consisting of a readout integrated circuit ROIC_D1 comprising at least one buried electrode EL_D1.

The readout integrated circuit ROIC_D1 is formed by a plurality of transistors and thin layers of conductive, semiconductor or dielectric materials according to CMOS-technology (Complementary Metal-Oxide-Semiconductor) on a silicon substrate. A buried electrode EL_D1 is associated with each pixel Pxl_D1 in order to read the signals generated by the photo charge carriers generated by the photodetecting structure of a pixel Pxl_D1.

With regard to the optical part of the device, this comprises a plurality of layers C1, C2, C3, with C1 and C3 being two conductive layers obtained by N+-doping a III-V (or II-VI) semiconductor material, and C2 being a semiconductor layer (III-V or II-VI) that is confined between the layers C1 and C3. The layer C2 acts as the photodetecting structure of the pixel Pxl_D1. A metal layer CM is deposited on the conductive layer C3 so as to form an upper metal contact that is associated exclusively with each pixel. The structuring of the interface C3/CM defines a diffraction grating. Each pixel of the optical part OPT_D1 is separated from an adjacent pixel of the matrix detector by way of a barrier made of dielectric material BMD. The lower layer C1 is common to a plurality of pixels and is connected to the electrical potential $V_{INF}$ representing an electrical ground for the entire device Dis1.

In the device Dis1, the metal layer C1 is a transparent (or poorly absorbing) conductor that allows light to pass. This makes it impossible to introduce a MIM (Metal-Insulator-Metal) structure because it is necessary to have, in the MIM structure, a layer C1 that is opaque to incident light.

In the context of the description of the invention, hybridization is understood to mean the set of specific operations and techniques for combining two parts having different functions (for example, the readout circuit ROIC_D1 and the photodetecting matrix OPT_D1). The hybridization of an optoelectronic system leads to the following interdependent technological problems:
- mechanically assembling the optical part and the electronic part without affecting the optical and/or electrical performance of the hybrid device.
- pixelation, consisting in creating the pixels and creating individualized access to the signal generated by each of the pixels of the matrix of the optical part.
- interconnection, consisting in creating an electrical interconnection architecture between each of the pixels Pxl_D1 and the readout electrode associated with said pixel.

In the case of the architecture described in FIG. 1, hybridization is achieved for each pixel by way of a metal ball B1 that electrically connects the readout electrode EL_D1 to the metal layer CM forming the upper metal contact associated exclusively with the same pixel. The ball B1 may for example be implemented with indium balls or copper micro-pillars that allow each pixel to have individualized contact with the readout circuit ROIC. It is then necessary to close the electrical circuit by a common contact on the front face of the photodetector, which the incident flux necessarily has to pass through. Indeed, the layer C1 is necessarily transparent (or weakly absorbent) to the optics on the side of the detected incident wave. This makes it technically impossible to integrate MIM resonators into the device according to the prior art. FIGS. 2a and 2b illustrate two examples of MIM (Metal/Insulator/Metal) optical resonators RO. It is possible to produce an optical nanoresonator via a microstructure comprising a photodetecting structure PD made of a semiconductor material SC1, an upper metal layer M1 acting as sub-wavelength antenna radiating element and a second reflective metal layer M2 acting as mirror. The photodetecting structure PD is confined between the reflective metal layer M2 and the upper metal layer M1.

The technical solutions according to the prior art of the methods of pixelation, assembly and interconnection on a readout circuit are not applicable to an optoelectronic system based on MIM optical resonator technology, because of the presence of the metal reflector on the non-incident face. Indeed, two cases are presented in the solutions of the prior art:

the incident face is on the common mirror side of the metal layer which leads to incompatibility with a MIM architecture since the mirror has to be opaque in such a structure.

the incident face is on the side of the upper metal layer and in this case it is not obvious to carry out the interconnection between the optical part and the readout integrated circuit ROIC.

The invention proposes an optical resonator structure for the problems of pixelation, assembly and interconnection of an optoelectronic device comprising at least one pixel, each pixel being produced via a single optical resonator connected to a single readout electrode of the readout integrated circuit.

American patent application US 1998 5773831A describes an infrared image detector comprising a plurality of optical resonators that form the detection matrix. The drawback of the solution described by that application is that the photodetecting layer covers the entire surface of the detection matrix, thus increasing the generation of unwanted dark noise and/or current.

American patent application US 2011 0156194A1 describes an infrared image detector comprising a plurality of optical resonators that form the detection matrix. The connection between a pixel and the readout circuit is made by way of a structure in the form of a nail connected to a metal ball. The drawback of the solution described by that application is that the interconnection structure comprising metal balls has a physical limit to the increase in resolution, given the size of the metal interconnection balls. In addition, the photodetecting layer covers the entire surface of the detection matrix, thus increasing the generation of unwanted dark noise and/or current. Another drawback is additionally cited, related to the drop in optical performance, since photons incident on the contact region will not be collected, resulting in a loss of quantum efficiency of the detector according to the prior art.

Response to the Problem and Provision of a Solution

To overcome the limitations of existing solutions with regard to the pixelation, the assembly and the interconnection of an optoelectronic device comprising at least one optical resonator connected to a single readout electrode of a readout integrated circuit, the invention proposes multiple embodiments of an architecture of an optical resonator based on MIM technology and compatible with a hybrid optoelectronic system. The invention furthermore proposes manufacturing processes for implementing the optical resonator structures. The processes proposed by the invention relate to processes that are compatible with a silicon production line for CMOS technology and processes for manufacturing wafers based on III-V or II-VI semiconductors. Advantageously, the technical solution according to the invention makes it possible to achieve hybridization of matrix detectors in the field of infrared imaging (wavelength from 1 µm to 70 µm, therefore including THz), and in particular the MWIR (mid-wave infrared, 3-5 µm) and LWIR (long-wave infrared, 8-12 µm) spectra for thermal imaging. The architecture proposed by the invention makes it possible to improve the performance of this type of device, since the hybridization of the system is adapted to the technical constraints of MIM optical nanoresonators.

SUMMARY OF THE INVENTION

One subject of the invention is an optoelectronic device comprising at least one pixel, each pixel comprising:

an optical resonator comprising a photodetecting structure confined between a first metal layer and a second reflective metal layer;

and a readout integrated circuit arranged on a substrate and comprising at least one buried readout electrode dedicated to the pixel and at least one metal or dielectric outer layer.

An assembly comprising at least the first layer of the resonator and the outer layer of the integrated circuit is referred to as planar assembly structure. The first metal layer is connected to the readout electrode by way of a metal via passing through the optical resonator structure and the planar assembly structure. The metal via is electrically isolated from the photodetecting structure and from the planar assembly structure.

According to one particular aspect of the invention, the metal via comprises a dielectric material internal passivation layer deposited on its internal walls so as to electrically isolate it from the second reflective metal layer and from the planar assembly structure.

According to one particular aspect of the invention, the metal via has a diameter smaller than the wavelength absorbed by the optical resonator divided by three times the effective refractive index of the photodetecting structure.

According to one particular aspect of the invention, the reflective metal layer is common to all of the pixels.

According to one particular aspect of the invention, the planar assembly structure comprises the second reflective metal layer, a third metal layer connected to electrical ground belonging to the readout integrated circuit and a passivation layer made of dielectric material belonging to the readout integrated circuit.

According to one particular aspect of the invention, at least one dimension of a resonator, chosen from among width and length, is within the interval [λ/2n−50%; λ/2n+50%], where A is an incident wavelength and n is an effective refractive index of the photodetecting structure.

According to one particular aspect of the invention, the height of the photodetecting structure is within the interval

[λ/4n−50%; λ/2n+50%], where λ is an incident wavelength and n is an effective refractive index of the photodetecting structure.

According to one particular aspect of the invention, the first metal layer covers the entire surface of the photodetecting mesa.

According to one particular aspect of the invention, the first metal layer covers part of the surface of the photodetecting structure. The first metal layer is fully covered by an encapsulating layer made of dielectric material.

According to one particular aspect of the invention, the inlet of the metal via is surrounded by an etch stop ring made of a dielectric material.

According to one particular aspect of the invention, the distance between two adjacent pixels is greater than or equal to the wavelength absorbed by the optical resonator divided by twice the effective refractive index of the photodetecting structure.

According to one particular aspect of the invention, the photodetecting structure is a layer made of a first II-VI or III-V semiconductor material or a stack of a plurality of layers of a plurality of semiconductor materials.

According to one particular aspect of the invention, the readout integrated circuit is formed on a silicon substrate.

Another subject of the invention is a process for manufacturing an optoelectronic device, the process comprising the steps of:
  assembling a first planar structure comprising a first substrate, an assembly of at least one photodetecting layer and a reflective metal layer, on the one hand;
  and a readout integrated circuit deposited on a second substrate and comprising at least one buried readout electrode and a metal or dielectric outer layer, on the other hand.
  An assembly comprising at least the reflective metal layer and the outer layer of the readout integrated circuit is referred to as planar assembly structure;
  detaching the first substrate;
  for each buried electrode: producing an optical resonator and connecting said optical resonator to the associated buried electrode by way of a metal via passing through the structure of the optical resonator and the planar assembly structure. The step of producing and connecting the optical resonator is carried out by:
    etching a via hole passing through said assembly of at least one photodetecting layer to the buried electrode;
    producing a passivation layer made of dielectric material, deposited on the internal walls of the via hole;
    depositing a conductive material on an outer surface of said assembly of at least one photodetecting layer, centered on the via hole, so as to produce a first metal layer,
    depositing the conductive material so as to fill the via hole with the conductive material and so as to produce the metal via electrically connecting said first metal layer to the buried electrode;
    selectively etching each of the layers of said assembly of at least one photodetecting layer to produce a photodetecting structure of the optical resonator; the photodetecting structure being confined between the reflective metal layer and said first metal layer.

According to one particular aspect of the invention, the step of producing and connecting an optical resonator to the associated buried electrode furthermore comprises the following sub-steps:
  depositing an encapsulating layer made of dielectric material covering the first metal layer.
  selectively etching the encapsulating layer so as to keep at least the parts covering the first metal layer.

According to one particular aspect of the invention, the process for manufacturing an optoelectronic device furthermore comprises:
  a step of depositing an etch stop layer on an outer layer of said assembly of at least one photodetecting layer prior to the step of producing and connecting an optical resonator to the associated buried electrode;
  in this particular aspect of the invention, the step of producing and connecting an optical resonator to the associated buried electrode furthermore comprises the following sub-steps:
    selectively etching the etch stop layer so as to produce an etch stop ring surrounding the access to the via hole and a cavity around said etch stop ring that serves to receive part of the first metal layer
    depositing a layer of conductive material on the via so as to connect it to the first metal layer.

According to one particular aspect of the invention, the conductive material deposited to produce the first metal layer and the metal via is gold or platinum.

According to one particular aspect of the invention, the conductive material deposited to produce the first metal layer and the metal via is copper or aluminum or tungsten.

According to one particular aspect of the invention, the step of simultaneously producing the via holes and the resonators is carried out by lithography then etching, the lithography technology being chosen from among: electron beam; nanoprinting; optical lithography, and the etching technology being chosen from among ion etching, chemical etching or plasma.

BRIEF DESCRIPTION OF THE DRAWINGS

Other features and advantages of the present invention will become more apparent on reading the following description in relation to the following appended drawings.

DETAILED DESCRIPTION

Figure 1:
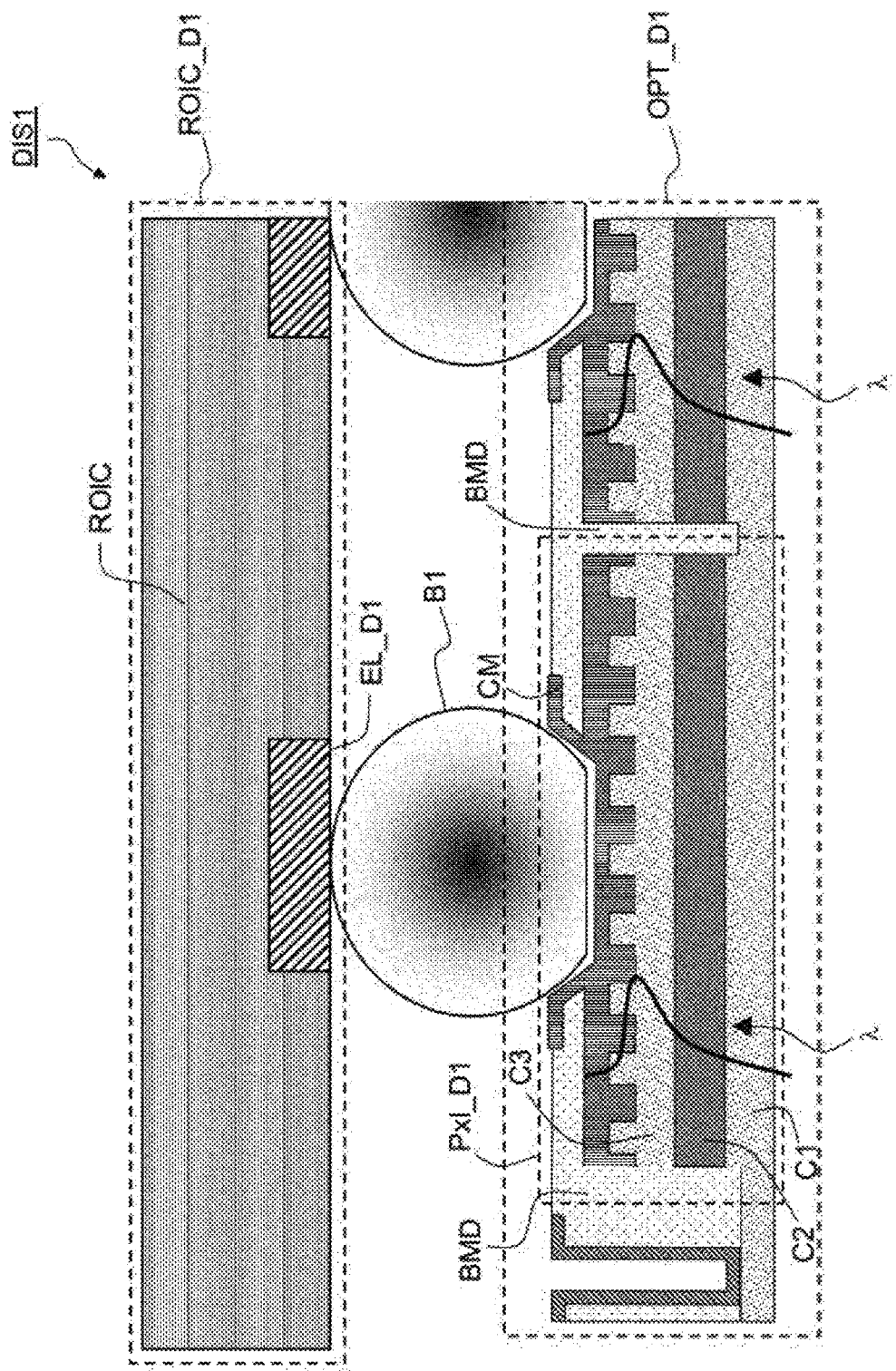
FIG. 1 illustrates a partial sectional view of a hybrid optoelectronic system according to the prior art, having an optical part comprising a diffraction grating.
Figure 2A:
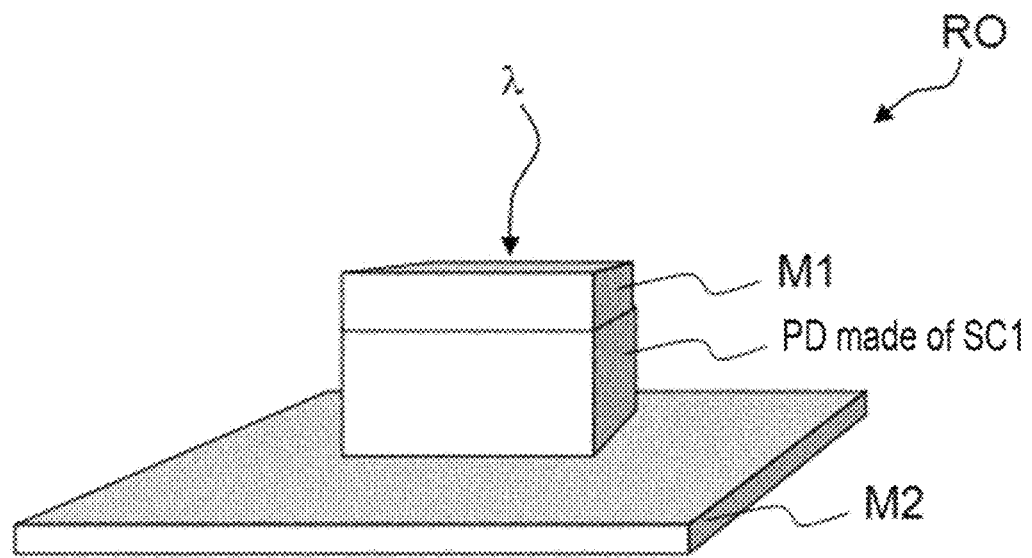
FIG. 2a illustrates a perspective view of one example of a cube-shaped optical resonator.
Figure 2B:
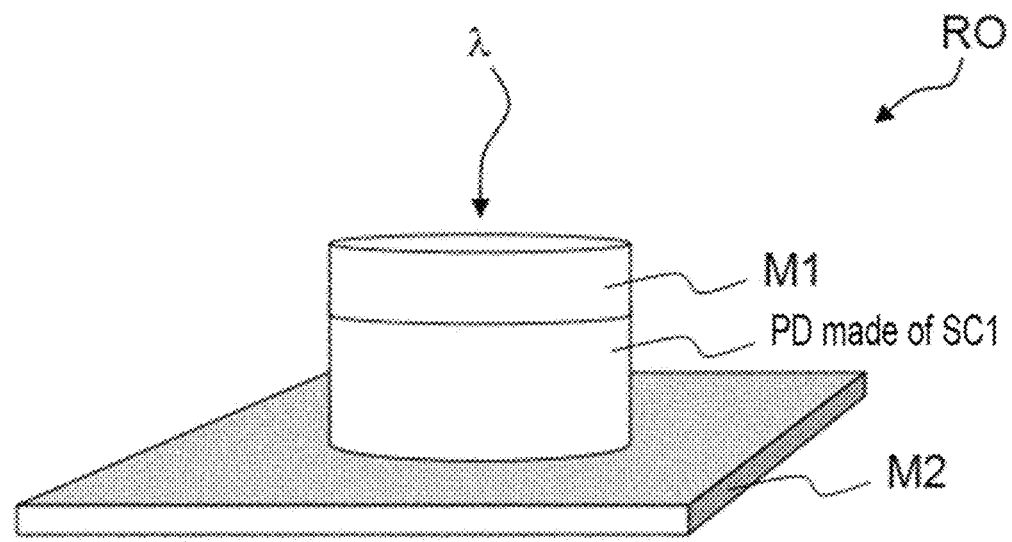
FIG. 2b illustrates a perspective view of one example of a cylinder-shaped optical resonator.
Figure 3:
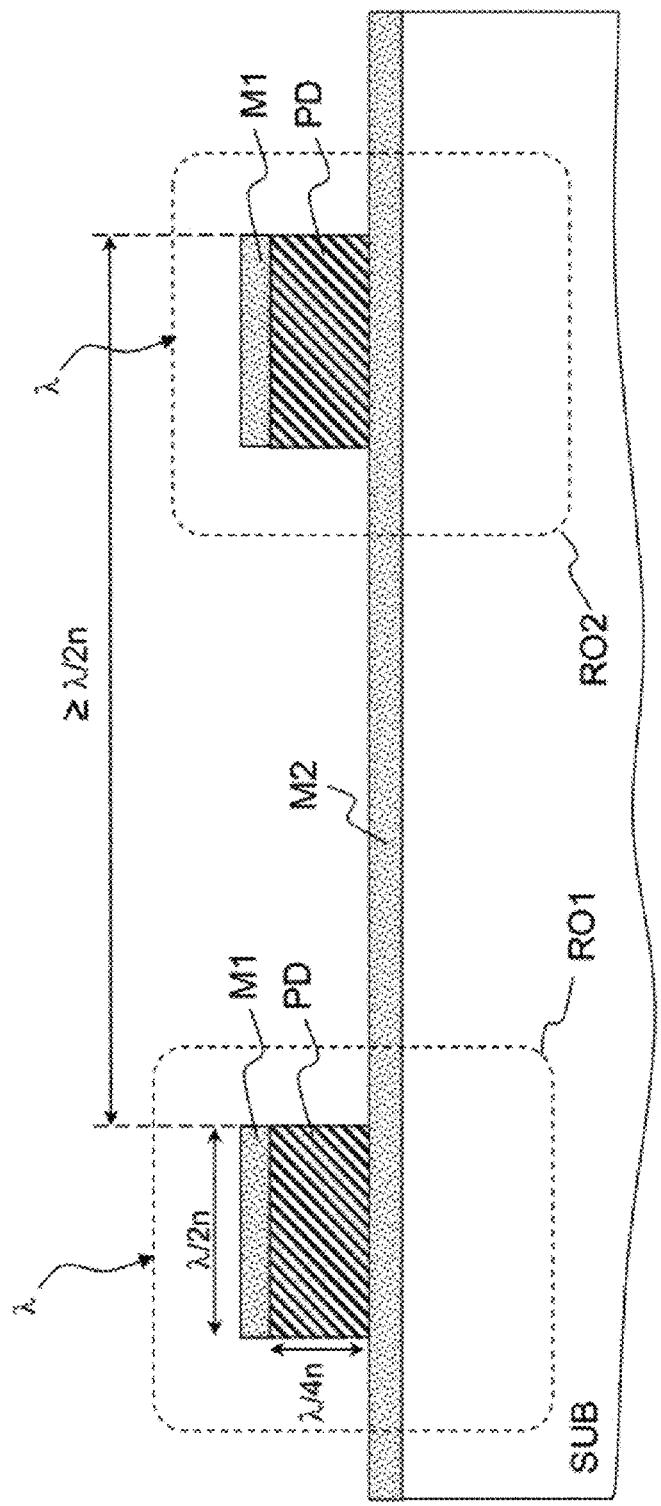
FIG. 3 illustrates a diagram of two optical resonators integrated into a matrix image detector in the infrared frequency region.

We will start by introducing the basic structure of a pair of optical resonators RO1 and RO2 that are not integrated into a hybrid system. FIG. 3 illustrates a diagram of two optical resonators integrated into a matrix image detector in the infrared frequency region.

The optical resonators RO1 and RO2 shown in FIG. 3 rest on a substrate SUB made of semiconductor material. We will limit ourselves at this stage to showing the substrate SUB to simplify the depiction.

Each optical resonator RO1 or RO2 comprises a photodetecting structure PD made of a first semiconductor material SC1 and defining a mesa, a first metal layer M1 and a second reflective metal layer M2. The photodetecting mesa structure SC2 is confined between the first metal layer M1 and the second reflective metal layer M2. A "mesa" is understood to mean a microstructure or nanostructure corresponding to a volume resting on a plane and having a flat upper surface.

The photodetecting structure PD is located in the photonic cavity formed by the optical resonator RO1 (or RO2). This structure is produced using a III-V material such as, by way of example, gallium arsenide, indium arsenide, gallium nitride, gallium antimonide, boron phosphide, as well as their ternary, quaternary or quinary alloys.

As an alternative, it is possible to produce photodetecting homojunctions that are obtained via doping variations or gradients in a structure made of semiconductor material.

As an alternative, it is possible to produce the photodetecting structure of an optical resonator RO1 (or RO2) with a stack of a plurality of layers. The stack is formed of different semiconductor materials, thus forming a photodetecting heterostructure. The semiconductor materials used to produce the stack of layers of the photodetecting heterostructure are III-V semiconductor materials such as, by way of example, gallium arsenide, indium arsenide, gallium nitride, gallium antimonide, boron phosphide, as well as their ternary or quaternary or quinary alloys. Doping these layers (N or P) makes it possible to define photodiode or photoconductor architectures.

According to one particular aspect of the invention, the photodetecting structure corresponds to a set of colloidal quantum dots (CQD).

The photodetecting layer (or structure) PD rests on the reflective metal layer M2 acting as mirror.

Generally speaking, the reflective layer M2 is common to all of the optical resonators RO of the hybrid device OPT, electrically connected to the electrical ground of the device.

In another embodiment, it is conceivable to have a reflective layer M2 dedicated to each pixel and therefore for each optical resonator RO since each optical resonator constitutes one pixel.

The metal layer M1 acts as radiating element of a sub-wavelength nano-antenna for an optical resonator, as described in FIG. 3. It is deposited on the exposed surface of the photodetecting mesa PD. The nanometer-scale dimensioning of the resonator allows it to absorb particular modes of a wave incident on the side of the upper layer M1 and having a wavelength A in the infrared region.

By way of indication, the reflective layer M2 and the upper layer M1 may be produced with gold (Au) having a layer thickness that varies between 25 nm and 500 nm for the reflective layer M2 and a layer thickness that varies between 150 nm and 1000 nm for an upper layer M1. In addition and by way of example, it is possible to produce the metal layers M1 and M2 with copper, aluminum, palladium, platinum, silver and tungsten.

Advantageously, if n denotes the refractive index of the material of the photodetecting mesa PD, the resonator RO1 (or RO2) is dimensioned as follows: at least one dimension of a resonator (and therefore of the upper layer M1), chosen from among width or length, is within the interval $[\lambda/2n-50\%; \lambda/2n+50\%]$ and the height of the photodetecting layer PD is within the interval $[\lambda/4n-50\%; \lambda/2n+50\%]$. Moreover, the distance separating two adjacent optical resonators is greater than $\lambda/2n$.

These dimensioning intervals make it possible to implement the resonator operation with the microstructures RO1 and RO2 described above. Indeed, each of the resonators enhances the light-matter coupling between the vertical cavity mode TM0 and the photosensitive layer PD, making it possible to enhance the response of low-quantum-efficiency technologies, such as quantum well intersubband detectors (QWIPs and QCDs) or II-VI colloidal quantum dots (CQD).

For a resonator, when the structure is resonant, light is then guided and focused in the photodetecting cavity PD under the upper layer M1, making it possible to guarantee an optimum modulation transfer function (MTF), by reducing (or even completely eliminating) optical and electrical crosstalk phenomena between the resonators. In the knowledge that, in the hybrid device OPT, each pixel corresponds to one or more interconnected resonators, the structure described by FIG. 3 then makes it possible to reduce the pixel pitch to its final dimension, corresponding to a sub-wavelength pitch. Moreover, the effective semiconductor volume is far smaller than in planar optoelectronic devices. Dark current and noise are thus reduced in the device OPT comprising resonators RO. We will add that this architecture is intrinsically fast because it has a low pixel capacity.

Figure 4A:
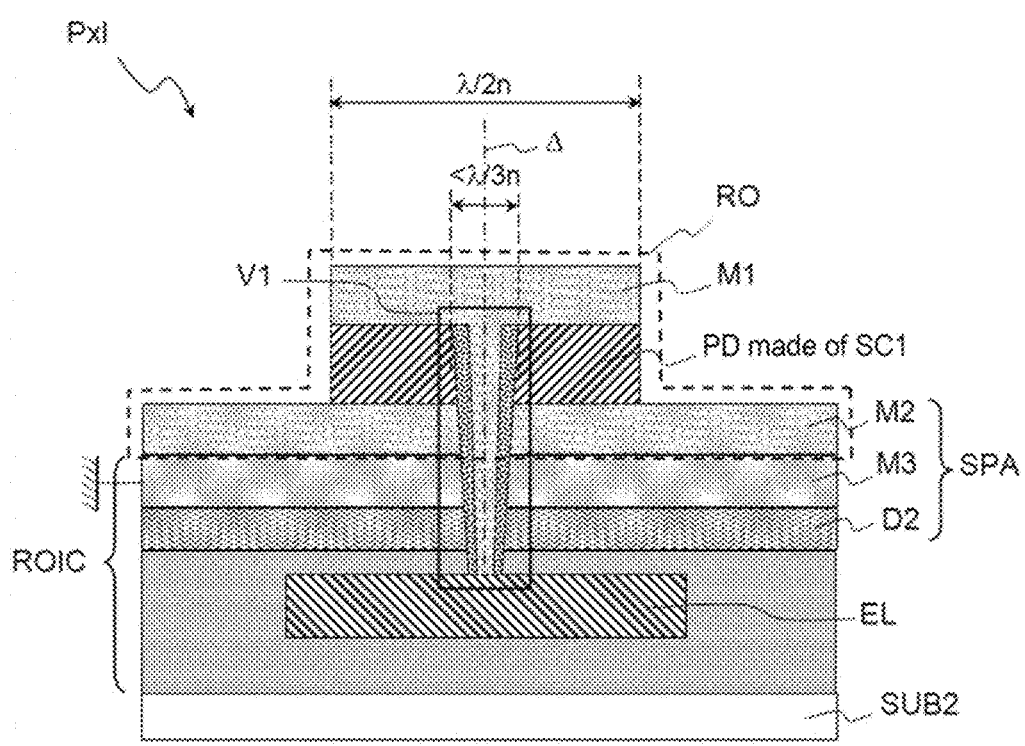
FIG. 4a illustrates a first embodiment of the hybridization of an optical resonator belonging to a hybrid optoelectronic system.

FIG. 4a illustrates a first embodiment of an optical resonator RO according to the invention, hybridized with a readout integrated circuit ROIC by connecting the upper metal layer M1 of the resonator RO to a buried readout electrode EL belonging to the readout integrated circuit ROIC.

A hybrid optoelectronic device comprises at least one pixel Pxl forming a matrix. In the solution described by the invention, each pixel comprises an optical resonator RO whose photodetecting structure PD is made of a first semiconductor material SC1 that is generally a III-V semiconductor material. The device furthermore comprises a readout integrated circuit ROIC that is made of a second semiconductor material SC2 that is generally silicon and is arranged on a silicon substrate Sub2. The readout circuit ROIC is generally formed by a plurality of transistors and thin layers of conductive, semiconductor or dielectric CMOS-technology material (not shown here to simplify the illustration) on the silicon substrate Sub2.

The wafer comprising the layers forming the optical part and the wafer comprising the readout circuit ROIC are assembled using a planar assembly structure SPA comprising a stack of layers belonging to the optical nano-resonator RO or to the readout integrated circuit ROIC. In the example illustrated by FIG. 4a, the planar assembly structure is formed on one side of the reflective metal layer M2 belonging to the optical part and on the other side of the stack of layers formed of the metal layer M3 connected to the electrical ground of the circuit ROIC and the dielectric passivation layer D2 of the circuit ROIC. More details on the assembly process will be given later.

As an alternative, it is possible to produce not a metal-metal assembly, as illustrated in FIG. 4a, but a dielectric-dielectric assembly. The planar assembly structure SPA in this case is formed of the outer dielectric passivation layer of the optical part and the outer dielectric passivation layer of the readout integrated circuit ROIC, as well as the metal mirror layer M2.

As described above, the optical resonator RO comprises a photodetecting structure PD made of III-V semiconductor material and defining a mesa for example, an upper metal layer M1 and a reflective metal layer M2. The photodetecting structure PD is confined between the reflective metal layer M2 and the upper metal layer M1 acting as radiating element of a sub-wavelength antenna.

A pixel Pxl belonging to the image detector OPT is hybridized according to the invention by way of a metal connection via V1 that electrically connects the upper metal layer M1 of the optical resonator RO (optical part) belonging to the pixel Pxl to the readout electrode EL associated with the same pixel and buried in the wafer of the circuit ROIC (electrical part). The connection via V1 is a through-via from the upper metal layer M1 to the buried electrode EL, passing through the photodetecting structure PD and the planar assembly structure SPA. This solution makes it possible to achieve pixelation because it makes it possible to individually read the signal generated by each pixel comprising a single resonator RO through which a via V1 passes. This solution is compatible with a "wafer to wafer" assembly, as shown in FIG. 4a by way of indication. This solution makes it possible to interconnect a hybrid system, making it possible to create an interconnection architecture between each of the pixels Pxl and the readout electrode associated with each pixel.

This solution is also compatible with a "die to wafer" assembly. A die is understood here to mean an integrated circuit manufactured beforehand on a semiconductor wafer and cut out beforehand from the wafer without mounting of a package. This solution is also compatible with a "multi-wafer to wafer" assembly.

The connection via passes through the central axis A of the structure of the resonator RO from the upper metal layer M1. The diameter of the via V1 at the access to the interface with the layer M1 is less than $\lambda/3n$, where A is the resonance wavelength and n is the effective refractive index of the first semiconductor material SC1. The via is produced at the center of the pixel since the horizontal optical mode TM1 has a weak field at the center. This positioning thus limits interference with the operation of the resonator by the via. This thus achieves the pixelation and the interconnection without degrading the performance of the optical resonator.

The via V1 has to pass through the planar assembly structure comprising the reflective metal layer connected to electrical ground and common to all of the pixels of the matrix.

Moreover, for each pixel Pxl, the via V1 passing through the associated resonator RO has to individually connect the metal layer M1 to the buried readout electrode EL.

Thus, the via V1 is passivated by depositing an inner passivation layer PI of dielectric material deposited on the internal walls thereof so as to electrically isolate it from the second reflective metal layer M2 and from the planar assembly structure SPA. The internal passivation layer PI thus takes on an optical protection role by isolating the via V1 from the photodetecting structure PD so as to avoid altering the optical performance of the resonator RO.

The structure of an infrared matrix detector pixel according to the invention described in FIG. 4a may be produced via a manufacturing process based on the technological steps of a production line for the manufacture of circuits or microsystems based on III-V semiconductors.

A "III-V process" is understood to mean the processes found in clean room environments commonly processing wafers in the format of 100 mm or smaller. Wafers are often processed individually, or in batches of a few units at most. Most of the handling of the wafers is manual. Lithography operations are carried out by contact-based or projection-based processes, with resolutions of the order of µm down to 500 nm. The metal layers and structures are structured by "lift-off" depositions or ion etching. The metals that are generally used are noble metals such as platinum (Pt), gold (Au) and silver (Ag). CMP bonding and planarization technological steps are uncommon with this type of process.

Figure 4B:
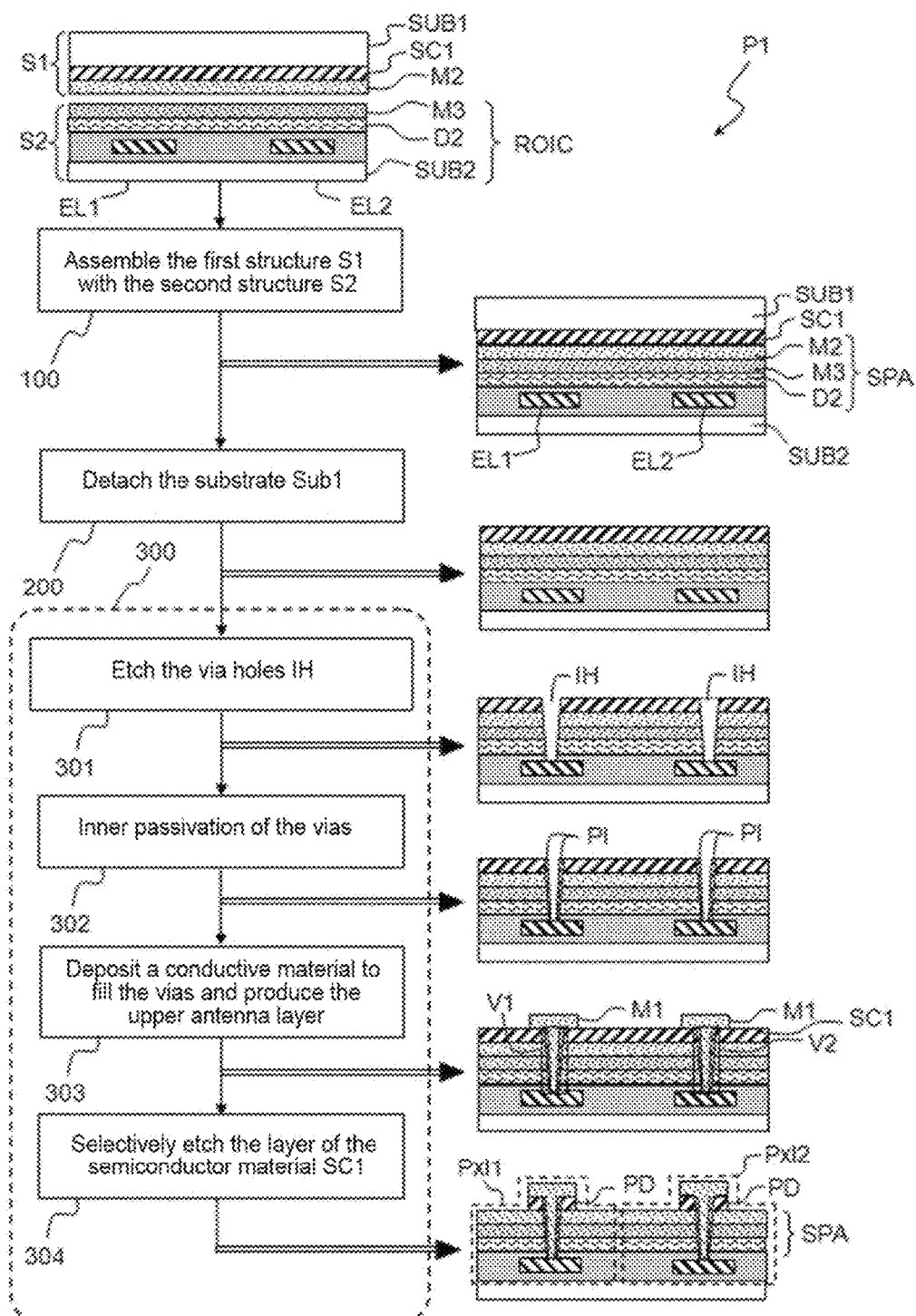
FIG. 4b illustrates a manufacturing process for producing an optical resonator belonging to a hybrid optoelectronic system according to the first embodiment.

The invention proposes a process of the "III-V process" type for manufacturing an optical resonator RO, but also for carrying out the assembly, the pixelation and the interconnection of the pixel Pxl containing the manufactured optical resonator. We will limit ourselves to showing the technological steps of the process P1 for two pixels Pxl1 and Pxl2 to simplify the understanding of the process. However, the steps of the process may be generalized for a plurality of pixels belonging to the same hybrid system, and they may be carried out simultaneously for the entire pixel matrix. The steps of this process are illustrated in FIG. 4b.

The first step 100 of the process P1 consists in assembling using a planar assembly structure SPA, a first planar structure S1 with an integrated readout circuit ROIC which have been manufactured beforehand. The first structure S1 has the sample used to manufacture the optical part and comprises a stack of a layer of a III-V semiconductor material (forming a photodetecting layer) and of a reflective metal layer M2. As explained above, it is conceivable to use, for the optical part, a first planar structure S1 comprising a stack of a plurality of layers of various semiconductor materials together forming a heterostructure of photodetecting layers which will be used to manufacture the photodetecting structures of the resonators. We will limit ourselves to showing a single photodetecting layer SC1 in the following illustrations for the sake of simplification but without loss of generality. The first structure is deposited on a first substrate Sub1. The readout integrated circuit ROIC is produced from a silicon wafer, is deposited on a second substrate Sub2 and comprises two buried readout electrodes EL1 and EL2. The first electrode EL1 is intended to read the signal from the first pixel Pxl1; the second electrode EL2 is intended to read the signal from the second pixel Pxl2.

The assembly is carried out by bonding, a technique that is developing rapidly and that constitutes important progress for carrying out what are known as "above IC" technological steps, that is to say steps that are able to be carried out directly on the wafer of the readout circuit ROIC, typically of CMOS type, and collectively on all of the dies. This compatibility with CMOS manufacturing means is conducive for a significant reduction in production costs and the possibility of achieving finer-sized technological patterns.

The result of the assembly step 100 is illustrated in the sectional view 100a, which shows the structure S1 assembled with the readout circuit ROIC such that the planar assembly structure SPA consists of the reflective metal layer M2 belonging to the first structure S1 and of the stack formed of a metal layer M3 connected to the electrical ground of the readout circuit ROIC and of a passivation layer of the circuit ROIC, denoted D2, made of dielectric material. The assembly step 100 then ensures the electrical connection of the reflective metal layer M2 to the overall electrical ground of the hybrid system.

The second step 200 consists in detaching the substrate Sub1 so as to keep only the substrate Sub2 on which the readout circuit ROIC is manufactured. The structure obtained after carrying out step 200 is illustrated in the sectional view 200a.

The third step 300 consists in producing, for each buried readout electrode EL, an optical resonator RO and in connecting said optical resonator RO to the associated buried electrode EL. More specifically, the connection is produced between the upper metal layer M1 of each resonator and the associated readout electrode. The connection is produced by way of a metal via V1 passing through the structure of the optical resonator RO and the planar assembly structure SPA as described above.

Step 300 of producing and connecting the optical resonator RO1 (and respectively RO2) comprises a succession of sub-steps compatible with a "III-V" process.

The first sub-step 301 consists in producing a via hole IH passing through the photodetecting layer (or the stack of photodetecting layers) from the first semiconductor material SC1 to the buried electrode EL1, passing through the planar assembly structure SPA. Sub-step 301 is carried out for example by way of an ion-etching or plasma-etching operation. The via holes IH obtained after carrying out sub-step 301 are illustrated in the sectional view 301a.

The second sub-step 302 consists in producing an internal passivation layer PI for each of the connection vias V1. This sub-step is carried out for example by first depositing a dielectric layer over the whole wafer so as to fill the holes IH, and then by selectively etching the dielectric layer so as to keep only part of the deposited layer covering the inner walls of each of the holes IH. The illustration 302a of the result of the sub-step of passivating the vias 302 shows the internal passivation layers that cover the walls while still leaving the possibility of accessing the readout electrodes EL through the holes IH.

The third sub-step 303 consists in depositing a conductive material on a surface of the layer of the first semiconductor material SC1, centered on each of the via holes IH so as to produce the upper metal layer M1 of each of the resonators RO. At the same time as producing the upper metal layers, sub-step 303 furthermore makes it possible to fill the via holes IH so as to produce, for each resonator RO, the metal via V1 electrically connecting the upper metal layer M1 to the buried electrode EL belonging to the same pixel Pxl.

The sub-step 303 is, for example, carried out via a "lift-off" deposition process. This is an additive technique used in microtechnology aimed at creating patterns of a target material (in this case the upper layers M1) on the surface of a substrate (in this case the stack of layers M2 and SC2) using a sacrificial material (generally a photoresist). The structure obtained after carrying out sub-step 303 is illustrated in the sectional view 303a. This shows the upper layers M1 of each of the resonators RO1 and RO2.

The fourth sub-step 304 consists in selectively etching the layer of the first semiconductor material SC1 so as to produce a photodetecting structure PD for each resonator. The illustration 304a of the result of this sub-step shows the photodetecting structure PD confined between the reflective metal layer M2, connected to electrical ground, and the upper metal layer M1, connected to the readout electrode EL.

The process P1 according to one embodiment of the invention thus makes it possible to produce at least one optical resonator RO according to the invention forming a pixel Pxl of an optoelectronic system while at the same time carrying out the operation of hybridizing the optical part with the electrical part of the system.

In the following section, we will describe a second embodiment of the optical resonator RO structure according to the invention, compatible with a "CMOS process" of a silicon foundry production line. A "CMOS process" is understood to mean the processes found in clean room environments processing large-format wafers (200 mm, 300 mm, 450 mm). Wafers are handled by automatons, and are often processed in batches of 10 to 25 units that connect directly onto the equipment. Lithography operations are step-by-step lithographies carried out by projection with largely sub-micron resolutions. The metals are structured using damascene processes comprising steps of depositing an insulating layer followed by etching the insulating layer, and then depositing metal in the cavity created, and finally CMP planarization to remove excess metal. The metal structures may also be produced by ion milling. Noble metals are less common because they contaminate CMOS structures, with the exception of copper, which is ubiquitous due to its use in the production of interconnection levels between transistors. Contamination by metal structures is managed via decontamination steps, and/or by encapsulation.

The use of a CMOS process to manufacture hybrid systems allows access to silicon production lines, and therefore to low-cost and high-volume manufacturing.

Figure 5A:
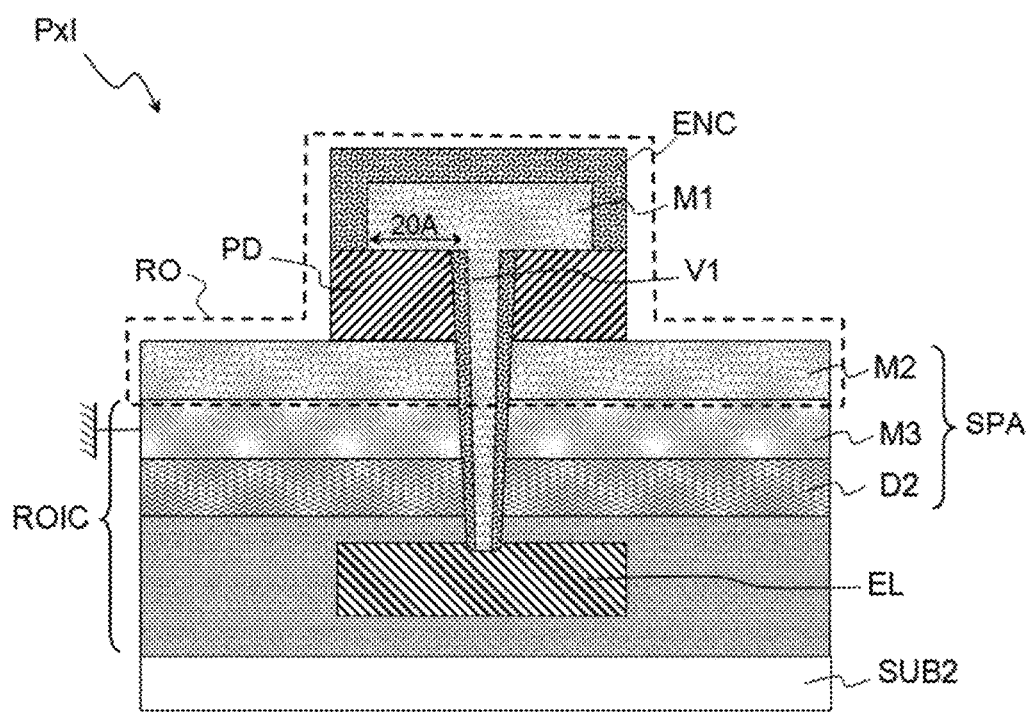
FIG. 5a illustrates a second embodiment of the hybridization of an optical resonator belonging to a hybrid optoelectronic system.

FIG. 5a illustrates a second embodiment of the hybridization of an optical resonator belonging to a hybrid optoelectronic system, according to the invention. This second embodiment is compatible with a "CMOS process".

The second embodiment of the optical resonator RO differs from the first embodiment by the following features:
the upper metal layer M1 covers part of the surface denoted 20A of the photodetecting structure PD, and not the entirety thereof, as in the first embodiment,
the upper metal layer M1 is encapsulated by an encapsulating layer ENC made of dielectric material so as to prevent copper from migrating and for example contaminating the other components of the system.

Figure 5B:
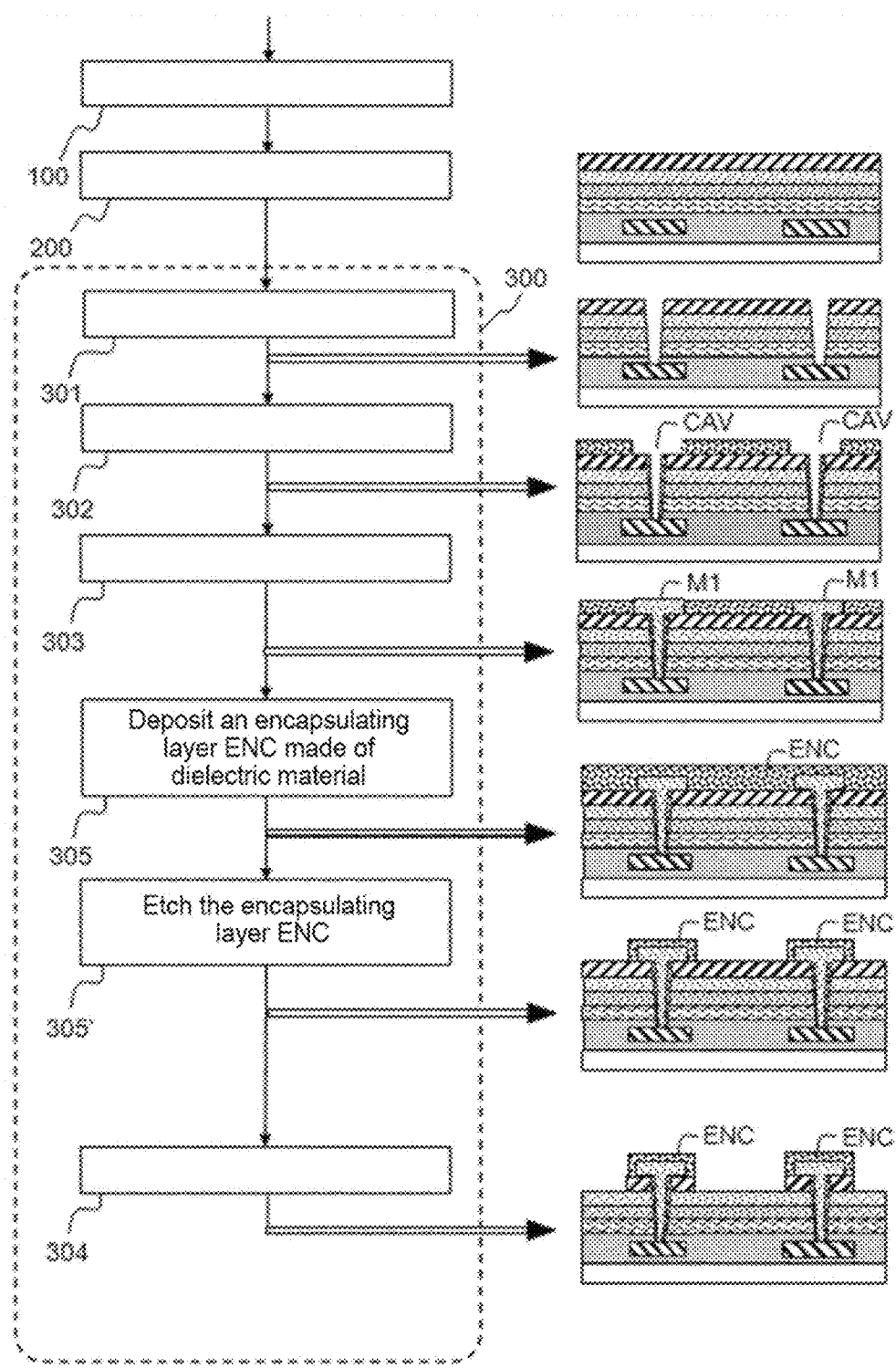
FIG. 5b illustrates a manufacturing process for producing an optical resonator belonging to a hybrid optoelectronic system according to the second embodiment.

FIG. 5b illustrates a manufacturing process P2 for producing an optical resonator belonging to a hybrid optoelectronic system according to a second embodiment.

The manufacturing process P2 is a "CMOS process". The assembly step 100 and detachment step 200 are similar to the process P1 described above.

Step 300 of producing and connecting the optical resonator RO1 (and respectively RO2) comprises a succession of sub-steps compatible with a "CMOS" process.

Sub-step 301 of etching holes IH is similar to that of the process P1 described above.

Sub-step 302 of internally passivating the vias V1 adopts the same principle as that of the process P1, with one difference: the selective etching of the dielectric layer defines cavities denoted Cav at the accesses to the holes IH that will subsequently serve to receive the upper metal structures M1 of each of the resonators. The illustration 302b of the result of this sub-step shows the cavities Cav obtained following the etching operation.

Sub-step 303 of producing the upper metal layers M1 is carried out using damascene processes as described above. The illustration 303b shows the metal layers M1 filling the cavities Cay.

In the process P2, step 300 furthermore comprises a sub-step 305 of depositing an encapsulating layer made of dielectric material covering all of the upper metal layers M1. Sub-step 305 is followed by a sub-step 305' of selectively etching the layer made of dielectric material deposited beforehand so as to keep at least the parts covering the upper metal layer M1, thus producing an encapsulating layer ENC as described in FIG. 5a.

Figure 5C:
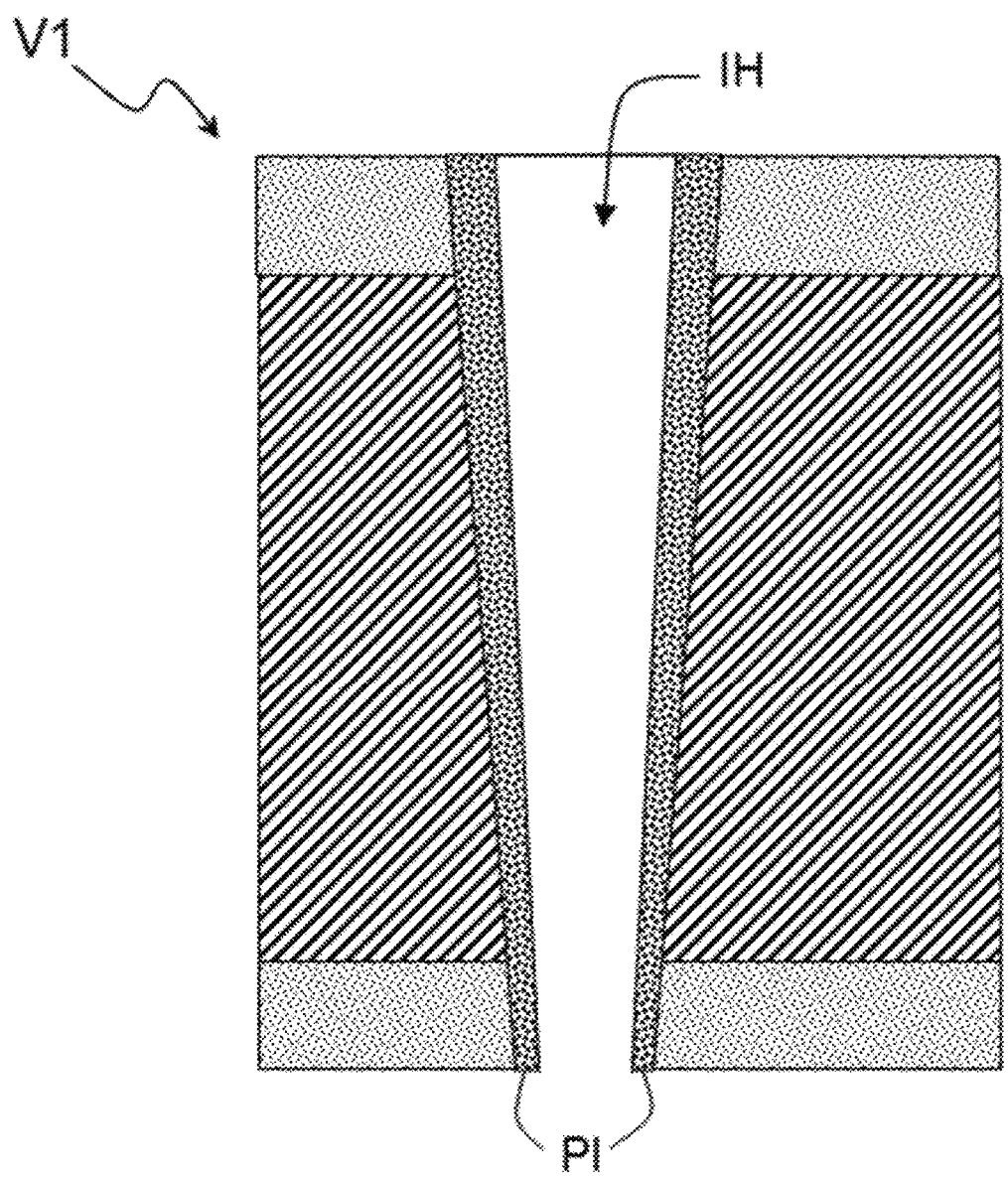
FIG. 5c illustrates a magnified theoretical sectional view at a passivated via hole produced with the process of FIG. 5b.

FIG. 5c illustrates a magnified theoretical sectional view at a passivated via hole produced with the process of FIG. 5b. Moreover, FIG. 5d illustrates a magnified realistic sectional view at a passivated via hole produced with the process of FIG. 5b.

The sub-step 302 of internally passivating the vias V1 comprises an operation of etching the dielectric layer so as to create the cavities Cav and keep only a thin dielectric layer on the internal walls of a via hole IH. FIG. 5c illustrates a magnified sectional view of the structure ideally obtained through this sub-step. However, from a practical point of view, the dielectric layer is generally overetched so as to avoid risks of short-circuiting at the access to the via V1. The structure obtained by overetching is illustrated in FIG. 5d: in this more realistic case, there is a risk of short-circuiting between the photodetecting structure PD and the upper metal layer M1. Specifically, the upper part of the photodetecting structure PD at the via hole IH is not covered by the dielectric layer. This part will then be in direct contact with the metal deposited so as to fill the via V1, thus affecting the performance of the optical resonator RO.

Figure 5D:
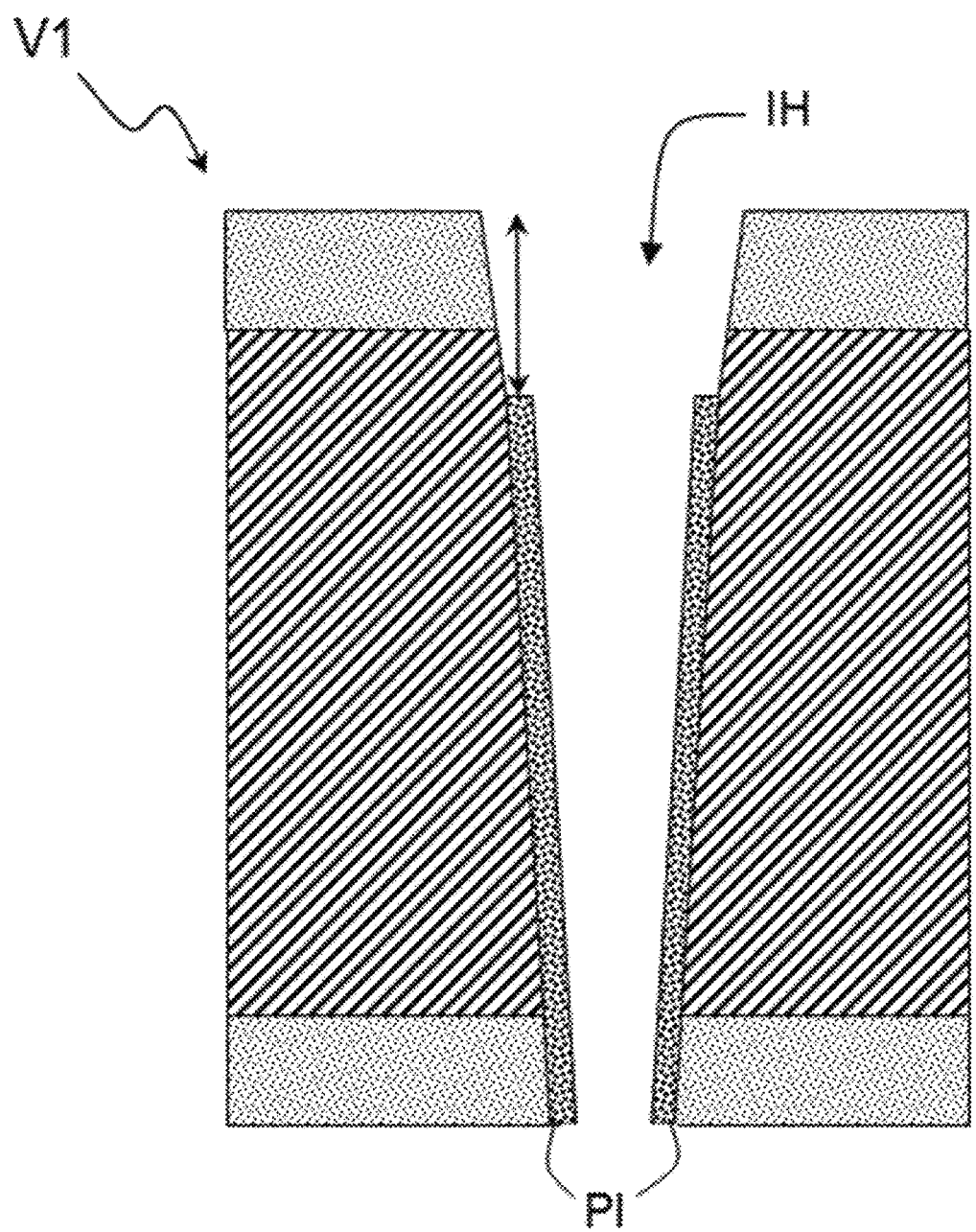
FIG. 5d illustrates a magnified realistic sectional view at a passivated via hole produced with the process of FIG. 5b.

A third embodiment of the architecture of an optical resonator according to the invention makes it possible to take into account the constraints described in FIG. 5d.

Figure 6A:
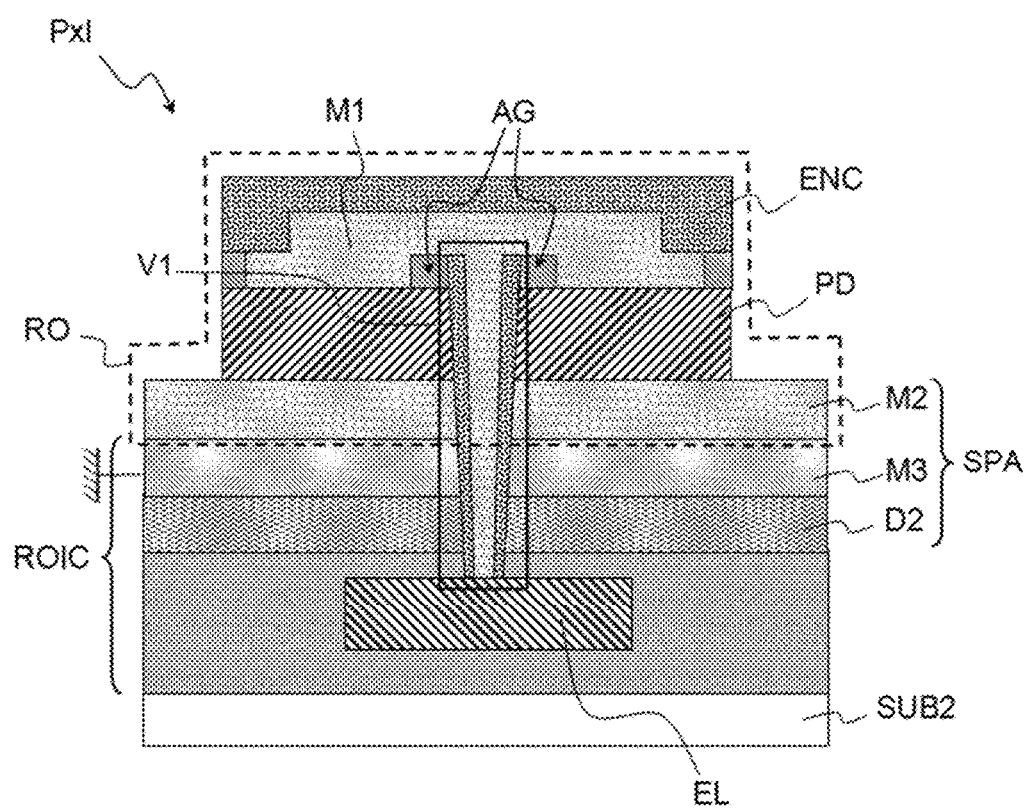
FIG. 6a illustrates a third embodiment of the hybridization of an optical resonator belonging to a hybrid optoelectronic system.

FIG. 6a illustrates a third embodiment of the hybridization of an optical resonator belonging to a hybrid optoelectronic system, making it possible to overcome the limitation described above. Indeed, the third embodiment of the optical resonator RO differs from the second embodiment by the following feature: the inlet of the metal via (V1) is surrounded by an etch stop ring AG (which may also be called a polishing stop ring) produced with a dielectric material. This ring structure makes it possible to stop the etching of the electric passivation layer exactly on the accesses to the via holes IH of each of the vias V1. This solution means having to produce an upper layer M1 having a greater thickness in the central region covering the access to the via V1 and the etch stop ring AG and a smaller thickness in a peripheral region.

Figure 6B:
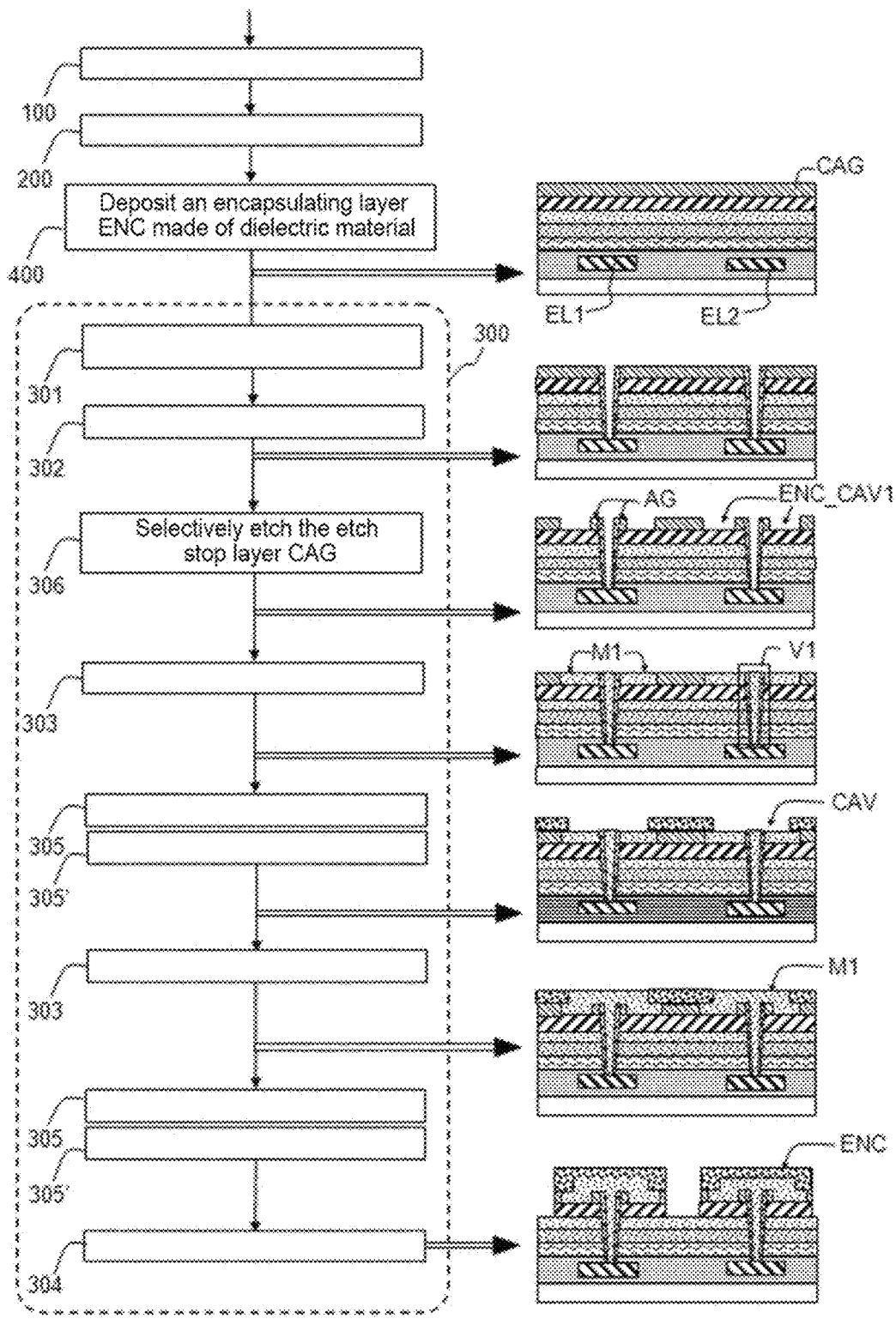
FIG. 6b illustrates a manufacturing process for producing an optical resonator belonging to a hybrid optoelectronic system according to the third embodiment.

FIG. 6b illustrates a manufacturing process P3 for producing an optical resonator belonging to a hybrid optoelectronic system according to the third embodiment.

The manufacturing process P3 is a "CMOS process". The assembly step 100 and detachment step 200 are similar to the processes P1 and P2 described above.

In the process P3, the third step 400 consists in depositing an etch stop layer CAG on the layer of the first semiconductor material SC1 prior to the step 300 of producing and connecting 300 an optical resonator RO1 (or RO2) to the associated buried electrode EL1 (or EL2).

The step 300 of producing and connecting the optical resonator RO1 (and respectively RO2) comprises a succession of sub-steps that are compatible with a "CMOS" process.

The first sub-step 301 of etching the holes IH is similar to that of the process P1 and P2 described above.

The second sub-step 302 of inner passivation of the vias V1 is similar to that of the process P1 and P2 described above.

The third sub-step 306 consists in selectively etching the etch stop layer CAG (which may also be called a polishing stop layer) so as to produce an etch stop ring AG (or polishing stop ring) surrounding the access to each of the via holes IH and a cavity ENC_CAV1 around said etch stop ring AG serving to receive the upper metal layer M1.

The fourth sub-step 303 consists in depositing a conductive material so as to fill the via hole IH with the conductive material and so as to produce the metal via V1 electrically connecting said upper metal layer M1 to the buried electrode EL1 (or EL2). In addition, sub-step 303 consists in depositing a conductive material so as to fill the cavity ENC_CAV1 around the etch stop ring AG in order to produce an upper metal layer M1.

The fifth sub-step 305 of depositing an encapsulating layer made of dielectric material is similar to sub-step 305 described for the process P2.

The sixth sub-step 305' consists in selectively etching the encapsulating layer ENC so as to expose the access of the via V1.

The seventh step 307 consists in depositing a layer of conductive material on the via V1 so as to connect the via V1 to the upper metal layer M1 surrounding the etch stop ring AG produced during the fourth sub-step 303.

The eighth sub-step 305 of depositing an encapsulating layer made of dielectric material is similar to the sub-step described for the process P2.

The ninth sub-step 305' of etching the encapsulating layer ENC is similar to sub-step 305' described for the process P2.

The tenth sub-step 304 consists in selectively etching the layer of the first semiconductor material SC1 so as to produce a photodetecting structure PD for each resonator in a manner similar to the processes P1 and P2.

The architecture of pixels according to the invention, based on optical resonators that are integrated with readout circuits described above, thus presents a new solution for producing matrix image sensors, having the following technical advantages:

- a compact pixel matrix architecture, making it possible to achieve a high resolution;
- an overall system with reduced volume in comparison with imagers from the prior art by virtue of the direct assembly between optical part and electrical part;
- improved optical performance, implementing the advantages of optical resonators;
- a reduction in dark noise by virtue of limiting the surface of photodetecting regions made of semiconductor materials;
- the reduction in crosstalk phenomena between the pixels since each pixel corresponds to an individual optical resonator.

To conclude, the described invention makes it possible to hybridize an optoelectronic system having at least one pixel comprising a MIM optical resonator. The pixelation and interconnection of a pixel is achieved by way of a connection via passing through the optical resonator structure for connecting it to the buried readout electrode belonging to the readout circuit ROIC. A number of embodiments of the structure of a pixel according to the invention have been described by way of indication without loss of generality. The described invention also makes it possible to carry out a manufacturing process for each embodiment. The first process P1 is compatible with a "III-V process" production line. The second process P2 and the third process P3 are compatible with a "CMOS process" production line.

The invention claimed is:

1. An optoelectronic device (OPT) comprising:
   at least one pixel (Pxl), each pixel comprising
   an optical resonator (RO) comprising a photodetecting structure (PD) confined between a first metal layer (M1) and a second reflective metal layer (M2);
   and a readout integrated circuit (ROIC) arranged on a substrate (Sub2) and comprising at least one buried readout electrode (EL) dedicated to the pixel (Pxl) and at least one metal or dielectric outer layer (M3, D2);
   the assembly comprising at least the second reflective metal layer (M2) and the outer layer (M3, D2) of the readout integrated circuit being referred to as planar assembly structure (SPA);
   the first metal layer (M1) being connected to the readout electrode (EL) by way of a metal via (V1) passing through the optical resonator (RO) structure and the planar assembly structure (SPA);
   the metal via (V1) being electrically isolated from the photodetecting structure (PD) and from the planar assembly structure (SPA).

2. The optoelectronic device (OPT) as claimed in claim 1, wherein the metal via (V1) comprises a dielectric material internal passivation layer (PI) deposited on its internal walls so as to electrically isolate it from the second reflective metal layer (M2) and from the planar assembly structure (SPA).

3. The optoelectronic device (OPT) as claimed in claim 2, wherein the metal via (V1) has a diameter smaller than the wavelength absorbed by the optical resonator (RO) divided by three times the effective refractive index of the photodetecting structure (PD).

4. The optoelectronic device (OPT) as claimed in claim 1, wherein the reflective metal layer (M2) is common to all of the pixels (Pxl).

5. The optoelectronic device (OPT) as claimed in claim 1, wherein the planar assembly structure (SPA) comprises the second reflective metal layer (M2), a third metal layer (M3) connected to electrical ground belonging to the readout integrated circuit (ROIC) and a passivation layer made of dielectric material belonging to the readout integrated circuit (ROIC).

6. The optoelectronic device (OPT) as claimed in claim 1, wherein at least one dimension of a resonator (RO), chosen from among width and length, is within the interval [$\lambda/2n-50\%$; $\lambda/2n+50\%$], where:
   $\lambda$ is an incident wavelength;
   n is an effective refractive index of the photodetecting structure.

7. The optoelectronic device (OPT) as claimed in claim 1, wherein the height of the photodetecting structure (PD) is within the interval [$\lambda/4n-50\%$; $\lambda/2n+50\%$], where:
   $\lambda$ is an incident wavelength;
   n is an effective refractive index of the photodetecting structure.

8. The optoelectronic device (OPT) as claimed in claim 1, wherein the first metal layer (M1) covers the entire surface (20A) of the photodetecting mesa (PD).

9. The optoelectronic device (OPT) as claimed in claim 1, wherein the first metal layer (M1) covers part of the surface (20A) of the photodetecting structure (PD); the first metal layer (M1) being fully covered by an encapsulating layer made of dielectric material (ENC).

10. The optoelectronic device (OPT) as claimed in claim 9, wherein the inlet of the metal via (V1) is surrounded by an etch stop ring (AG) made of a dielectric material.

11. The optoelectronic device (OPT) as claimed in claim 1, wherein the distance between two adjacent pixels (Pxl) is greater than or equal to the wavelength absorbed by the optical resonator (RO) divided by twice the effective refractive index of the photodetecting structure (PD).

12. A matrix image sensor comprising an optoelectronic device as claimed in claim 1.

13. A process for manufacturing an optoelectronic device (OPT), the process comprising the steps of:
   assembling a first planar structure (S1) comprising a first substrate (Sub1), an assembly of at least one photodetecting layer (SC1) and a reflective metal layer (M2), on the one hand;
   and a readout integrated circuit (ROIC) deposited on a second substrate (Sub2) and comprising at least one buried readout electrode (EL1, EL2) and a metal or dielectric outer layer (M3), on the other hand;
   the assembly comprising at least the reflective metal layer (M2) and the outer layer (M3, D2) of the readout integrated circuit (ROIC) being referred to as planar assembly structure (SPA);
   detaching the first substrate (Sub1);
   for each buried electrode (EL1, EL2): producing an optical resonator (RO) and connecting said optical resonator (RO) to the associated buried electrode (EL1, EL2) by way of a metal via (V1) passing through the structure of the optical resonator (RO) and the planar assembly structure (SPA); the step of producing and connecting the optical resonator (RO) being carried out by:
   etching a via hole (IH) passing through said assembly of at least one photodetecting layer to the buried electrode (EL1, EL2);
   producing a passivation layer (PI) made of dielectric material, deposited on the internal walls of the via hole (IH);
   depositing a conductive material on an outer surface of said assembly of at least one photodetecting layer (SC1), centered on the via hole (IH), so as to produce a first metal layer (M1),
   depositing the conductive material so as to fill the via hole (IH) with the conductive material and so as to produce the metal via (V1) electrically connecting said first metal layer (M1) to the buried electrode (EL1, EL2);
   selectively etching each of the layers of said assembly of at least one photodetecting layer so as to produce a photodetecting structure (SC1) of the optical resonator (RO); the photodetecting structure (SC1) being confined between the reflective metal layer (M2) and said first metal layer (M1).

14. The process for manufacturing an optoelectronic device (OPT) as claimed in claim 13, wherein the step of producing and connecting an optical resonator (RO) to the associated buried electrode (EL1, EL2) furthermore comprises the following sub-steps:
   depositing an encapsulating layer made of dielectric material (ENC) covering the first metal layer (M1);
   selectively etching the encapsulating layer (ENC) so as to keep at least the parts covering the first metal layer (M1).

15. The process for manufacturing an optoelectronic device (OPT) as claimed in claim 14, comprising:
   a step of depositing an etch stop layer (CAG) on an outer layer of said assembly of at least one photodetecting layer (SC1) prior to the step of producing and connecting an optical resonator (RO) to the associated buried electrode (EL1, EL2), and wherein the step of producing and connecting an optical resonator (RO) to the associated buried electrode (EL1, EL2) furthermore comprises the following sub-steps:

selectively etching the etch stop layer (CAG) so as to produce an etch stop ring (AG) surrounding the access to the via hole (IH) and a cavity (ENC_CAV1) around said etch stop ring (AG) that serves to receive part of the first metal layer (M1), depositing a layer of conductive material on the via so as to connect it to the first metal layer (M1).

16. The process for manufacturing an optoelectronic device (OPT) as claimed in claim 13, wherein the conductive material deposited to produce the first metal layer (M1) and the metal via (V1) is gold or silver or platinum.

17. The process for manufacturing an optoelectronic device (OPT) as claimed in claim 14, wherein the conductive material deposited to produce the first metal layer (M1) and the metal via (V1) is copper or aluminum or tungsten.

18. The process as claimed in claim 13, wherein the step of simultaneously producing the via holes (IH) and the resonators (RO) is carried out by lithography then etching, the lithography technology being chosen from among: electron beam; nanoprinting; optical lithography, and the etching technology being chosen from among ion etching, chemical etching or plasma.

* * * * *